US011570927B1

(12) United States Patent
Chen

(10) Patent No.: US 11,570,927 B1
(45) Date of Patent: Jan. 31, 2023

(54) SERVER APPARATUS AND TRAY MECHANISM THEREOF

(71) Applicant: Wistron Corporation, New Taipei (TW)

(72) Inventor: Wei-Hao Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/516,663

(22) Filed: Nov. 1, 2021

(30) Foreign Application Priority Data

Jul. 20, 2021 (TW) .................................. 110126675

(51) Int. Cl.
*H05K 7/14* (2006.01)

(52) U.S. Cl.
CPC .................................. *H05K 7/1489* (2013.01)

(58) Field of Classification Search
None
See application file for complete search history.

(56) References Cited

U.S. PATENT DOCUMENTS

| 5,997,326 | A | * | 12/1999 | Koradia | ............. | H01R 12/7005 |
| | | | | | | 439/372 |
| 8,432,670 | B2 | | 4/2013 | Chen | | |
| 10,219,401 | B1 | * | 2/2019 | Chang | .................. | H05K 7/1492 |
| 10,317,949 | B1 | * | 6/2019 | Lin | ......................... | H05K 5/023 |
| 10,327,547 | B1 | * | 6/2019 | Shih | ........................ | A47B 88/48 |
| 10,607,658 | B1 | * | 3/2020 | Qian | ..................... | G11B 33/022 |
| 2007/0149018 | A1 | * | 6/2007 | Gunther | ............... | H05K 7/1414 |
| | | | | | | 439/160 |
| 2011/0119866 | A1 | * | 5/2011 | Lee | ......................... | G06F 1/187 |
| | | | | | | 16/110.1 |
| 2013/0100593 | A1 | * | 4/2013 | Yin | ....................... | H05K 7/1489 |
| | | | | | | 361/679.01 |
| 2014/0184040 | A1 | * | 7/2014 | Li | .......................... | H05K 5/023 |
| | | | | | | 312/223.1 |
| 2020/0112774 | A1 | * | 4/2020 | Lee | ......................... | H04Q 1/025 |
| 2022/0141985 | A1 | * | 5/2022 | Chang | .................. | H05K 7/1489 |
| | | | | | | 361/725 |

FOREIGN PATENT DOCUMENTS

CN 102262892 A 11/2011

* cited by examiner

*Primary Examiner* — James Wu
*Assistant Examiner* — Christopher L Augustin
(74) *Attorney, Agent, or Firm* — Winston Hsu

(57) ABSTRACT

A server apparatus includes a casing having a first engaging structure, a tray mechanism including a tray, a handle and an elastic member, and a server module disposed on the tray. The handle is pivoted to the tray. The elastic member connected to the tray and has an interfering structure. The interfering structure interferes with the handle to position the handle for making the handle not interfere with the first engaging structure when the tray is inserted into the casing along an insertion direction.

20 Claims, 12 Drawing Sheets

US 11,570,927 B1

SERVER APPARATUS AND TRAY MECHANISM THEREOF

BACKGROUND OF THE INVENTION

1. Field of the Invention

The present disclosure relates to a server apparatus and a tray mechanism thereof, and more specifically, to a server apparatus utilizing an elastic member to interfere with a handle for positioning the handle and a tray mechanism thereof.

2. Description of the Prior Art

In a conventional server assembly process, a server module including related server components (e.g., display cards and mainboards) is mounted on a tray first, and then the tray having the server module disposed thereon is inserted into a server casing through a front opening of the server casing. As such, the server assembly process can be completed quickly and conveniently.

The prior art usually adopts the design in which a handle located at a front end of the tray is utilized to hook an engaging structure located on a partition of the casing for fixing the tray to the casing and drive the server module to be connected to internal ports in the casing. However, when a user pushes the handle to insert the tray into the casing, the handle may collide with the engaging structure easily since the user cannot keep the handle higher than the engaging structure constantly, so as to cause damage or jamming of components in the server apparatus.

SUMMARY OF THE INVENTION

The present disclosure provides a server apparatus. The server apparatus includes a casing, a tray mechanism, and at least one server module. The casing has a first engaging structure. The tray mechanism includes a tray, a handle, and an elastic member. The tray has a first board. The handle has at least one pivot portion. The pivot portion is pivoted to the first board to make the handle rotatable between a first position and a second position relative to the tray. The elastic member is connected to the first board and has at least one interfering structure penetrating through the first board. The interfering structure interferes with the pivot portion to keep the handle at the first position and to make the pivot portion and the first engaging structure not interfere with each other when the tray is inserted into the casing along an insertion direction. The server module is disposed on the tray.

The present disclosure further provides a tray mechanism suitable for assembly of at least one electronic module and a casing. The casing has a first engaging structure formed thereon. The tray mechanism includes a tray, a handle, and an elastic member. The tray has a first board. The electronic module is disposed on the tray. The handle has at least one pivot portion. The pivot portion is pivoted to the first board to make the handle rotatable between a first position and a second position relative to the tray. The elastic member is connected to the first board and has at least one interfering structure penetrating through the first board. The interfering structure interferes with the pivot portion to keep the handle at the first position and to make the pivot portion and the first engaging structure not interfere with each other when the tray is inserted into the casing along an insertion direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
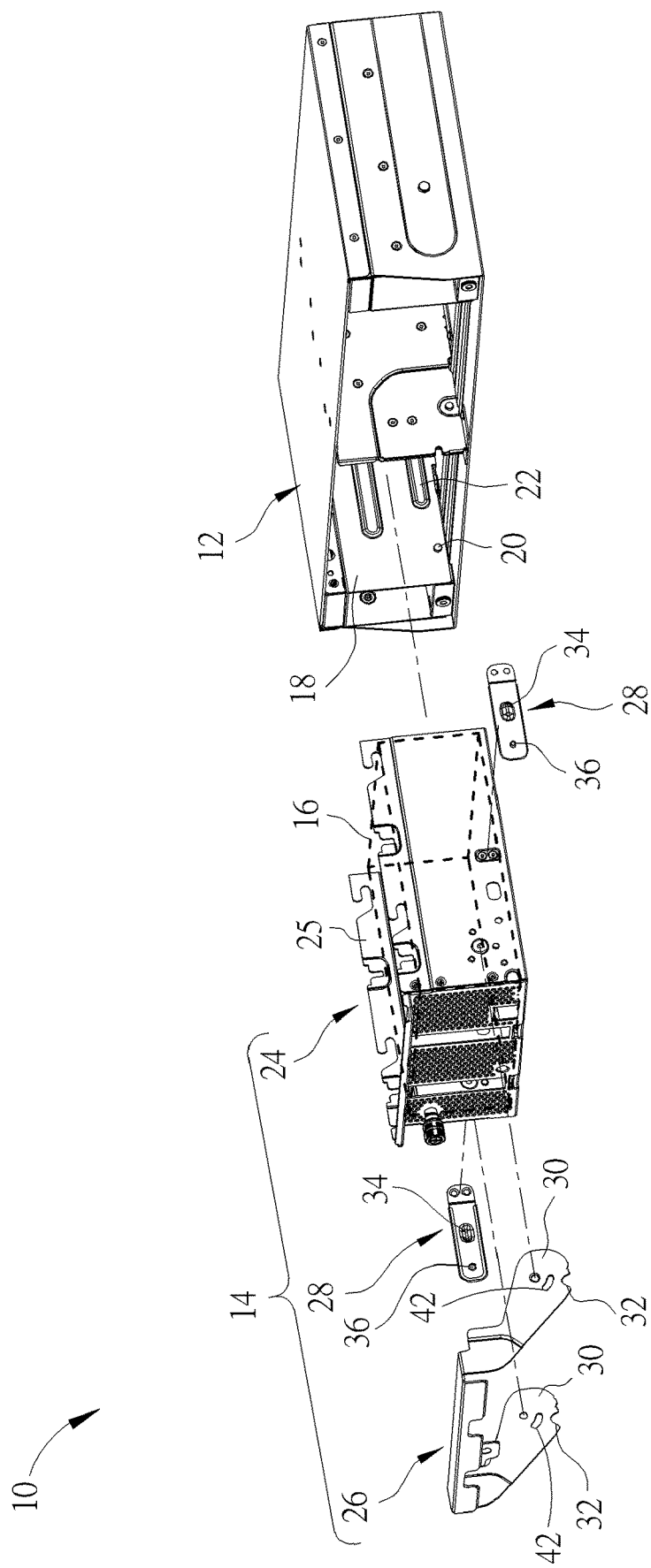
FIG. 1 is a partial exploded diagram of a server apparatus according to an embodiment of the present disclosure.
Figure 2:
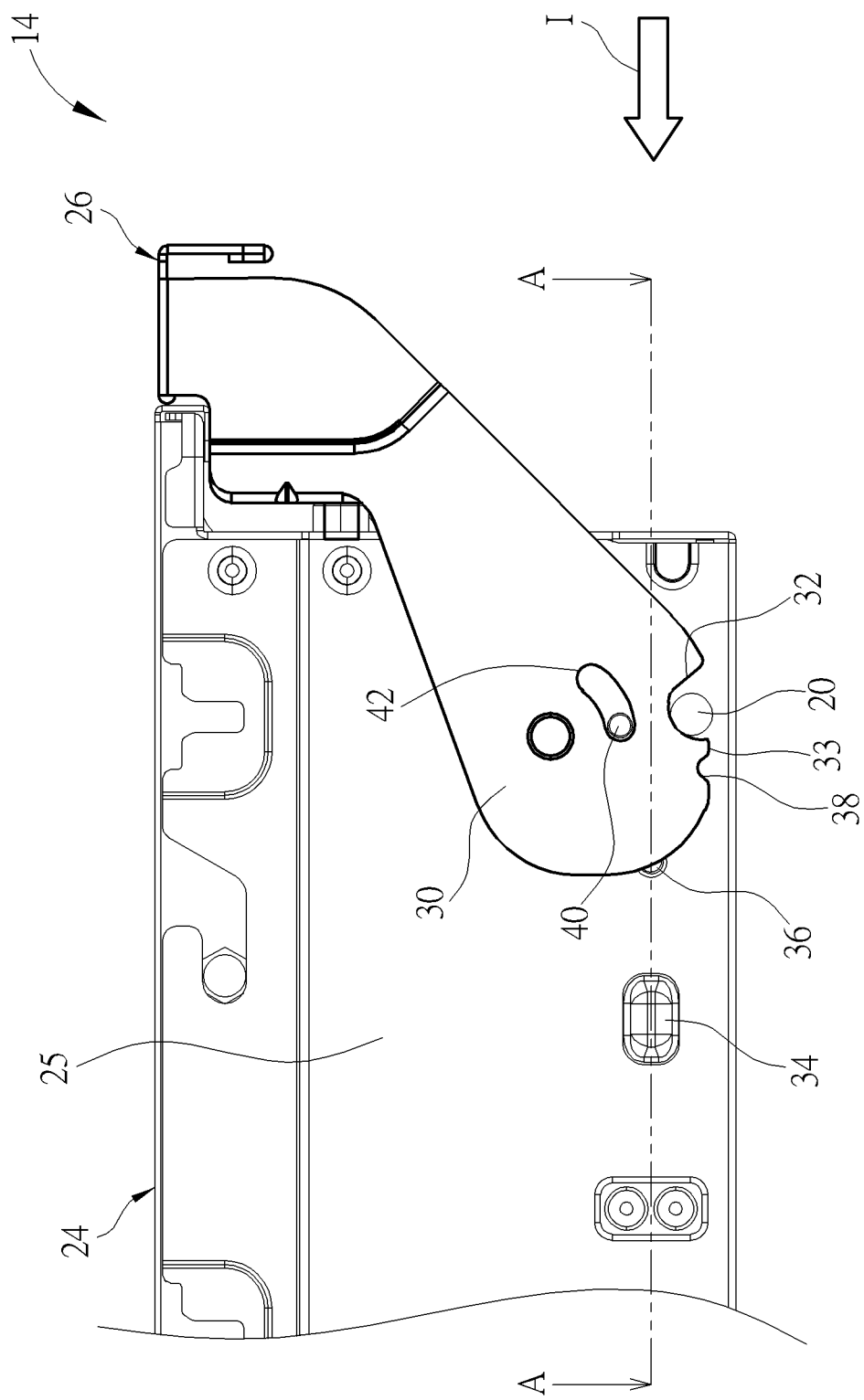
FIG. 2 is a partial side view of a tray mechanism in FIG. 1.

Please refer to FIG. 1 and FIG. 2. FIG. 1 is a partial exploded diagram of a server apparatus 10 according to an embodiment of the present disclosure. FIG. 2 is a partial side view of a tray mechanism 14 in FIG. 1. For clearly showing the internal structural relationship of the server apparatus 10, a casing 12 is depicted briefly by a first engaging structure 20 in FIG. 2. As shown in FIG. 1 and FIG. 2, the server apparatus 10 includes the casing 12, a tray mechanism 14, and at least one server module 16 (one shown in FIG. 1 and briefly depicted by dotted lines, but the present disclosure is not limited thereto). That is, the tray mechanism 14 of the present disclosure could be preferably applied to assembly of the server module 16 and the casing 12, but the present disclosure is not limited thereto, meaning that the tray mechanism 14 could be applied to assembly of the casing 12 and other electronic module (e.g. a hard disk array module) and the related description could be reasoned by analogy according to the following description and figures and omitted herein.

For example, the fixing design of the tray mechanism 14 could be preferably applied to partitions at two sides of the casing 12 for mounting the server module 16 in the casing 12 effortlessly and steadily (but the present disclosure is not limited thereto, which means the present disclosure could be only applied to one partition at one side of the casing 12 for simplifying the mechanical design of the server apparatus 10). More detailed description for the fixing design of the tray mechanism 14 and one of second boards 18 of the casing 12 is provided as follows, and the related description for the fixing design of the tray mechanism 14 and the other second board 18 could be reasoned by analogy and omitted herein.

As shown in FIG. 1 and FIG. 2, a first engaging structure 20 and a first protruding structure 22 could be preferably formed on the second board 18 (i.e., a partition) of the casing 12, and the tray mechanism 14 includes a tray 24, a handle 26, and an elastic member 28 (e.g., an elastic sheet, but the present disclosure is not limited thereto). The server module 16 is disposed on the tray 24 and is mounted in the casing 12 via the tray 24. The handle 26 has a pivot portion 30. The pivot portion 30 is pivoted to a first board 25 of the tray 24 corresponding to the second board 18 to make the handle 26 rotatable between a first position and a second position relative to the tray 24. The pivot portion 30 could preferably have a second engaging structure 32 (but the present disclosure is not limited thereto). The elastic member 28 could be preferably connected to the first board 25 by a riveting process or a screw locking process (but the present disclosure is not limited thereto) and have a second protruding structure 34 and an interfering structure 36 penetrating through the first board 25. The first protruding structure 22 could protrude inward from the second board 18 of the casing 12 by a punching process, and the second protruding structure 34 could protrude outward from the elastic member 28 by a punching process for interfering with the first protruding structure 22. The first engaging structure 22 could be preferably a positioning pillar, the second engaging structure 32 could be preferably a notch, and the interfering structure 36 could be preferably a protruding pillar to abut against a protruding edge 33 of the second engaging structure 32 for generating the positioning effect. To be more specific, in this embodiment, a limiting recess 38 extends from the protruding edge 33 (but the present disclosure is not limited thereto, meaning that the present disclosure could adopt the design in which the interfering structure 36 directly abuts against the protruding edge 33). Accordingly, the interfering structure 36 can be engaged with the limiting recess 38 for positioning the handle 26 at the first position steadily.

To be noted, the interfering structural design adopted by the present disclosure is not limited to the design in which one single interfering structure is utilized to interfere with the pivot portion mentioned in the aforesaid embodiment, meaning that the present disclosure could adopt a multi-point interfering design instead. For example, in another embodiment, the interfering structures 36 could be formed on the elastic member 28 corresponding to two sides of the pivot portion 30 respectively for preventing clockwise and counterclockwise rotation of the pivot portion 30, so as to achieve the purpose that the handle 26 is positioned at the first position steadily. Furthermore, in practical application, a limiting pin 40 protrudes from the first board 25, and an arc-shaped slot 42 is formed on the pivot portion 30 corresponding to the limiting pin 40. As such, the limiting pin 40 can be disposed through the arc-shaped slot 42 for limiting the rotation range of the handle 26, so as to efficiently prevent a user from over-rotating the handle 26 to cause damage or interference of the components when the user operates the tray mechanism 14.

Figure 3:
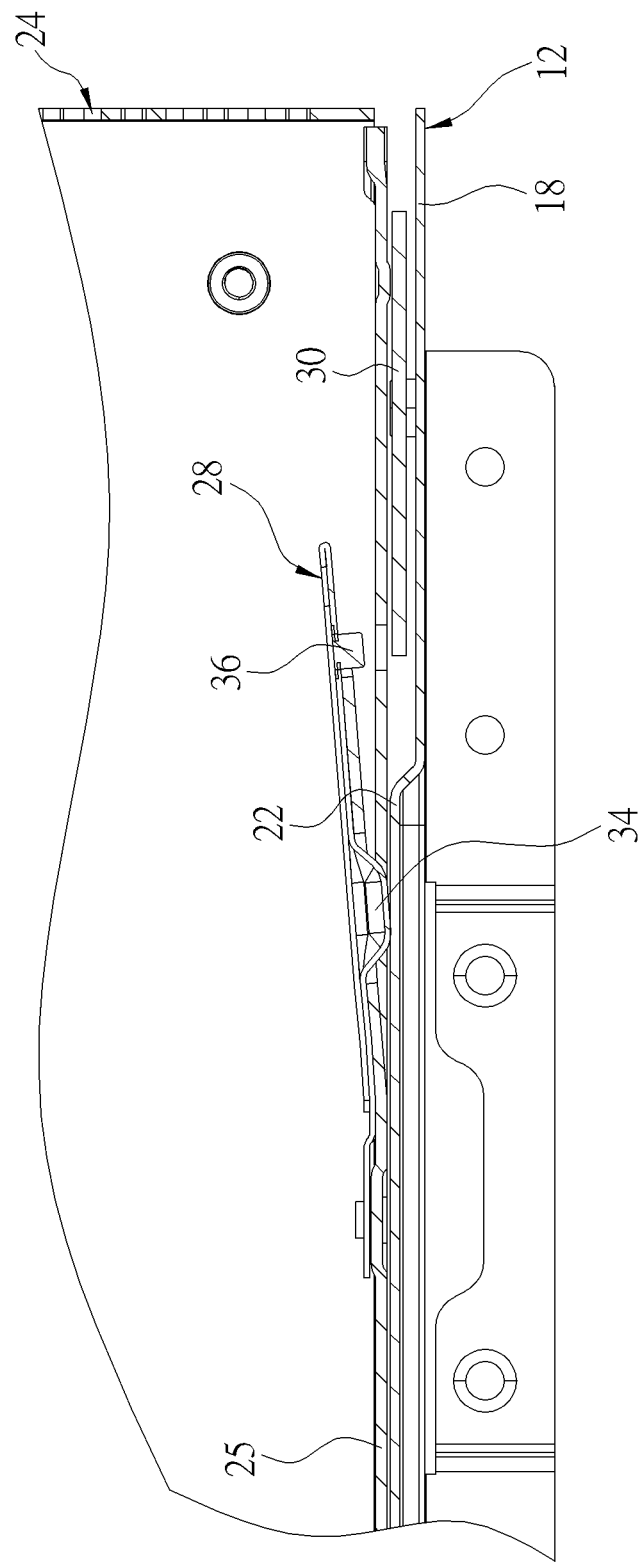
FIG. 3 is a cross-sectional diagram of the tray mechanism in FIG. 2 along a cross-sectional line A-A.
Figure 4:
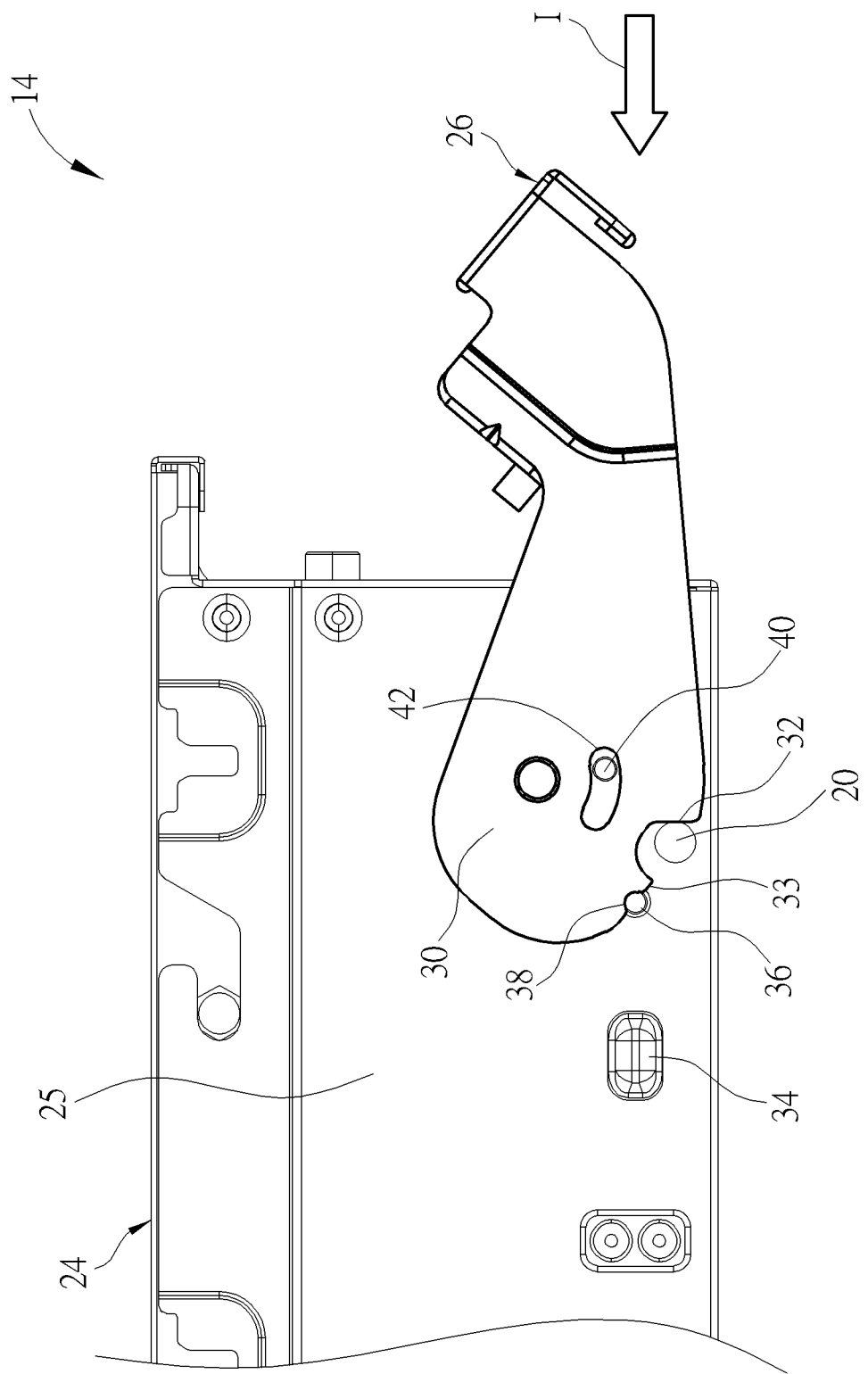
FIG. 4 is a partial side view of the tray mechanism in FIG. 2 when a handle rotates to a first position.
Figure 5:
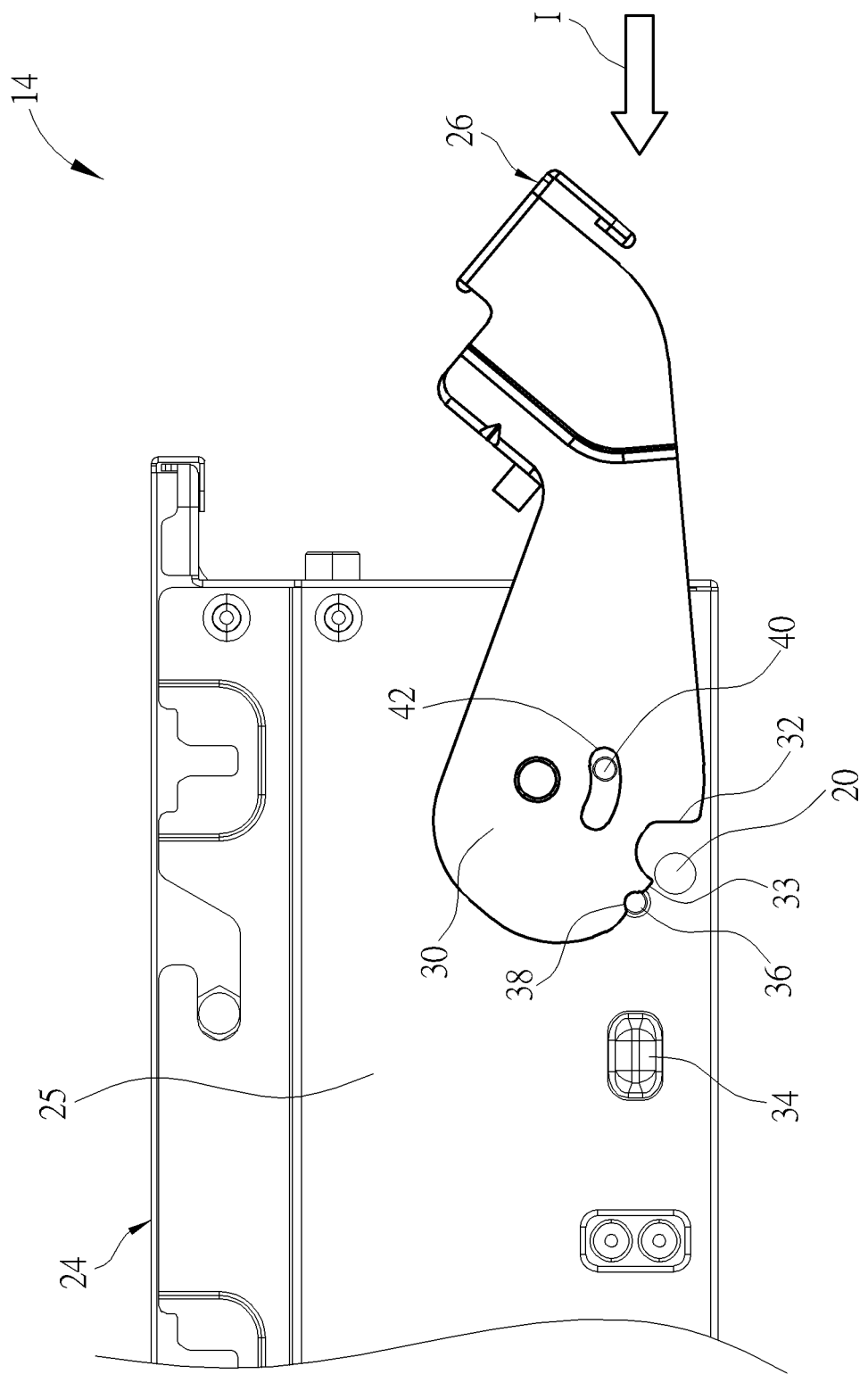
FIG. 5 is a partial side view of the tray mechanism being inserted into a casing along an insertion direction.
Figure 6:
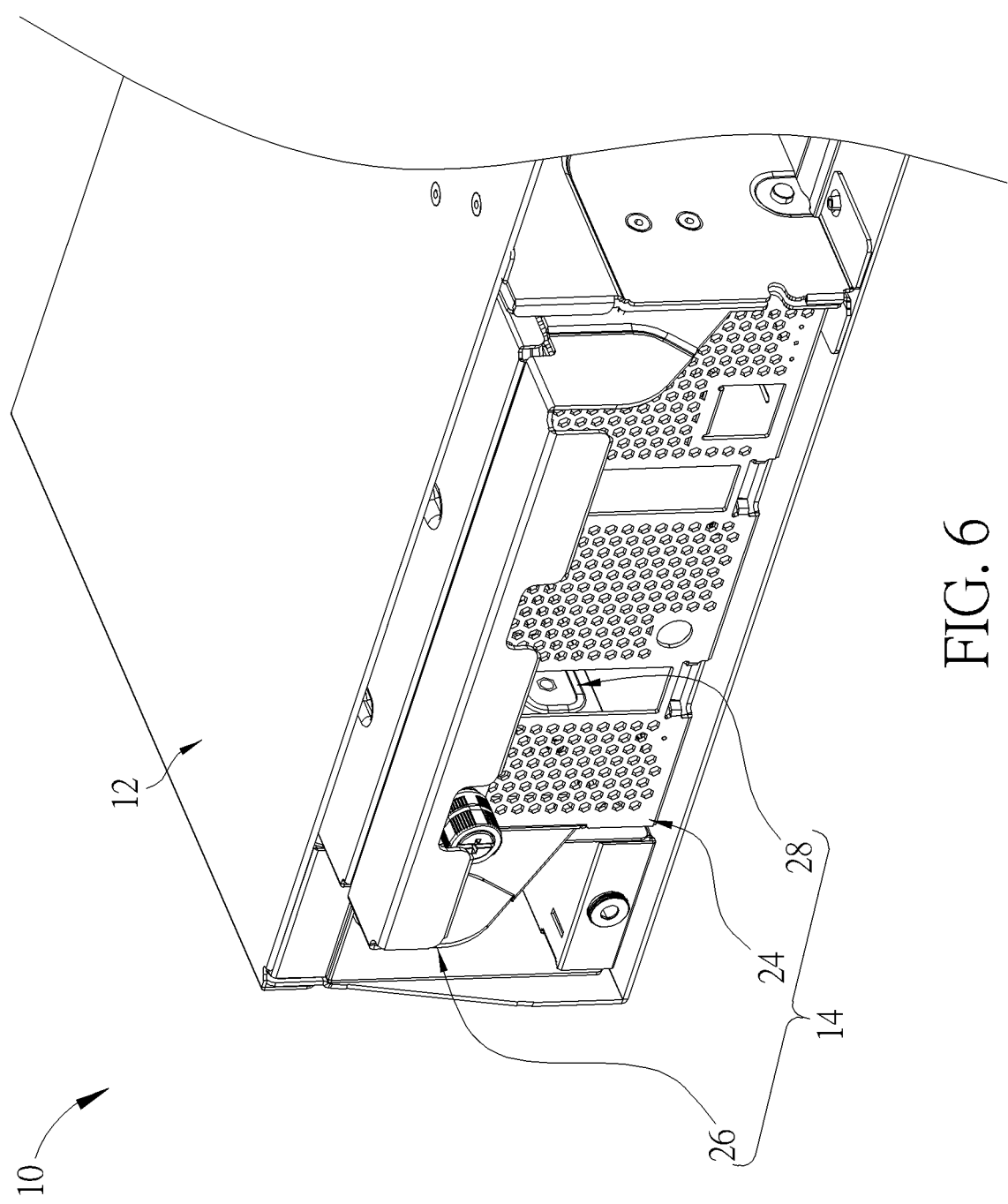
FIG. 6 is a partial diagram of the tray mechanism in FIG. 2 being disposed in the casing.

More detailed description for the operation of the tray mechanism 14 is provided as follows. Please refer to FIG. 2, FIG. 3, FIG. 4, FIG. 5 and FIG. 6. FIG. 3 is a cross-sectional diagram of the tray mechanism 14 in FIG. 2 along a cross-sectional line A-A. FIG. 4 is a partial side view of the tray mechanism 14 in FIG. 2 when the handle 26 rotates to the first position. FIG. 5 is a partial side view of the tray mechanism 14 being inserted into the casing 12 along the insertion direction I. FIG. 6 is a partial diagram of the tray mechanism 14 in FIG. 2 being disposed in the casing 12. When the handle 26 is located at the second position as shown in FIG. 2, the second engaging structure 32 can be engaged with the first engaging structure 20, to make the tray mechanism 14 disposed in the casing 12 steadily. At this time, as shown in FIG. 3, the first engaging structure 22 can push the second protruding structure 34 to cause elastic deformation of the elastic member 28, so as to move the interfering structure 36 relative to the first board 25 for not interfering with the pivot portion 30. As such, the handle 26 can be rotatable between the second position and the first position.

On the other hand, when the user wants to perform the extraction operation of the tray mechanism 14, the user just needs to pull the handle 26 to rotate from the second position as shown in FIG. 2 to the first position as shown in FIG. 4. During this process, the second engaging structure 32 abuts against the first engaging structure 20 to move and rotate for pushing the tray 24 in a direction opposite to the insertion direction I. Subsequently, since the second engaging structure 32 no longer hooks the first engaging structure 20, the user can pull the handle 26 to extract the tray 24 outward relative to the casing 12, so as to make the second protruding structure 34 not interfere with the first protruding structure 22 with outward movement of the tray 24 relative to the casing 12. Accordingly, the interfering structure 36 can protrude from the first board 25 to be engaged with the limiting recess 38 for positioning the handle 26 at the first position. Finally, the user can keep pulling the handle 26 to extract the tray mechanism 14 having the server module 16 mounted therein out of the casing 12 completely for subsequent replacement or maintenance of the server module 16.

On the contrary, when the user wants to perform the assembly operation of the tray mechanism 14, the user just needs to push the handle 26 (at this time, as mentioned above, the interfering structure 36 is engaged with the limiting recess 38 to position the handle 26 at the first position steadily) to insert the tray mechanism 14 into the casing 12 along the insertion direction I. During this process, as shown in FIG. 5, the second engaging structure 32 is misaligned with the first engaging structure 20 without interference (in this embodiment, it means that the protruding edge 33 of the second engaging structure 32 is higher than the first engaging structure 20). In such a manner, the present disclosure can surely prevent the second engaging structure 32 from colliding with the first engaging structure 20 when the tray mechanism 14 is inserted into the casing 12 along the insertion direction I, so as to allow that the user can insert the tray mechanism 14 to a position as shown in FIG. 4 along the insertion direction I smoothly. At this time, as shown in FIG. 3, since the first protruding structure 22 has already interfered with the second protruding structure 34 to cause elastic deformation of the elastic member 28, the interfering structure 36 can move relative to the first board 25 to not interfere with the pivot portion 30. Subsequently, the user can rotate the handle 26 from the first position as shown in FIG. 4 to the second position as shown in FIG. 2 for rotating the second engaging structure 32 to hook the first engaging structure 20. As such, the tray mechanism 14 can be mounted in the casing 12 steadily (as shown in FIG. 6), so as to complete the assembly operation of the tray mechanism 14.

In summary, via the design in which the interfering structure of the elastic member is utilized to interfere with the pivot portion of the handle to position the handle at the first position, the present disclosure can surely prevent the handle of the tray mechanism from interfering with the first engaging structure of the casing when the tray is inserted into the casing. In such a manner, the present disclosure can efficiently solve the prior art problem that the handle of the tray collides with the engaging structure of the casing easily during the mounting process to cause damage or jamming of components in the server apparatus, so as to greatly improve the service life and the operational convenience of the tray mechanism.

Figure 7:
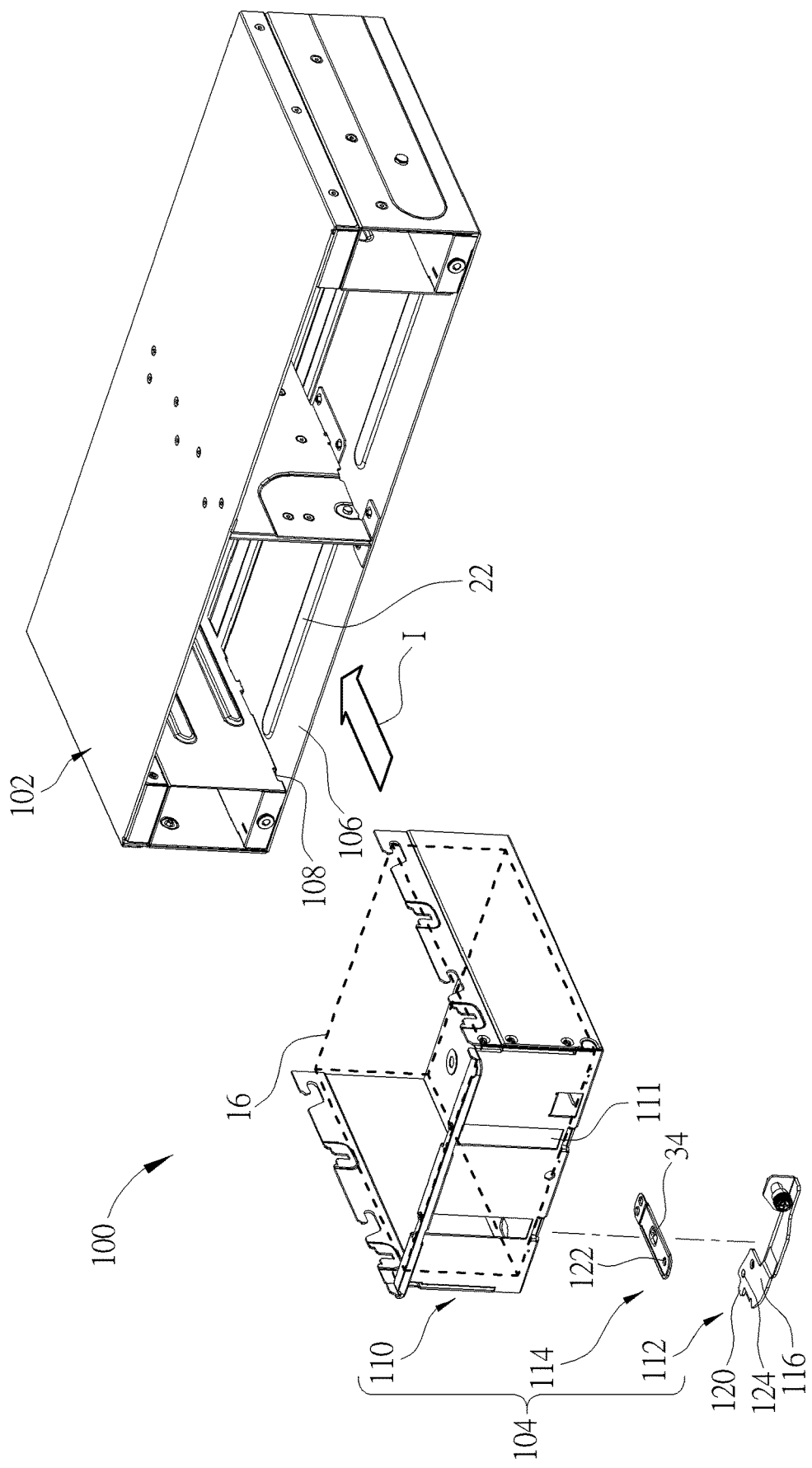
FIG. 7 is a partial exploded diagram of a server apparatus according to another embodiment of the present disclosure.
Figure 8:
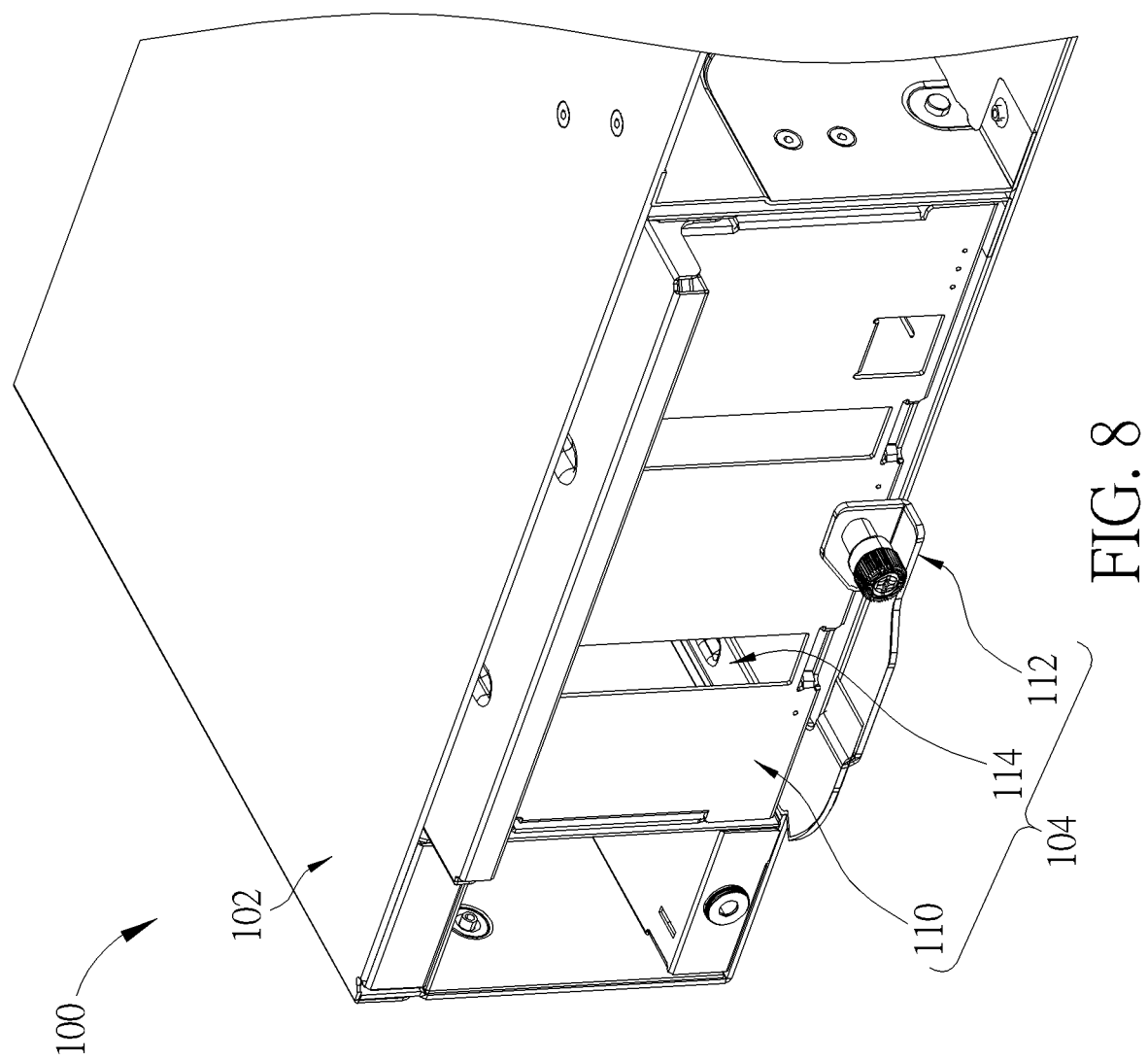
FIG. 8 is a partial diagram of a tray mechanism in FIG. 7 being inserted into a casing.
Figure 9:
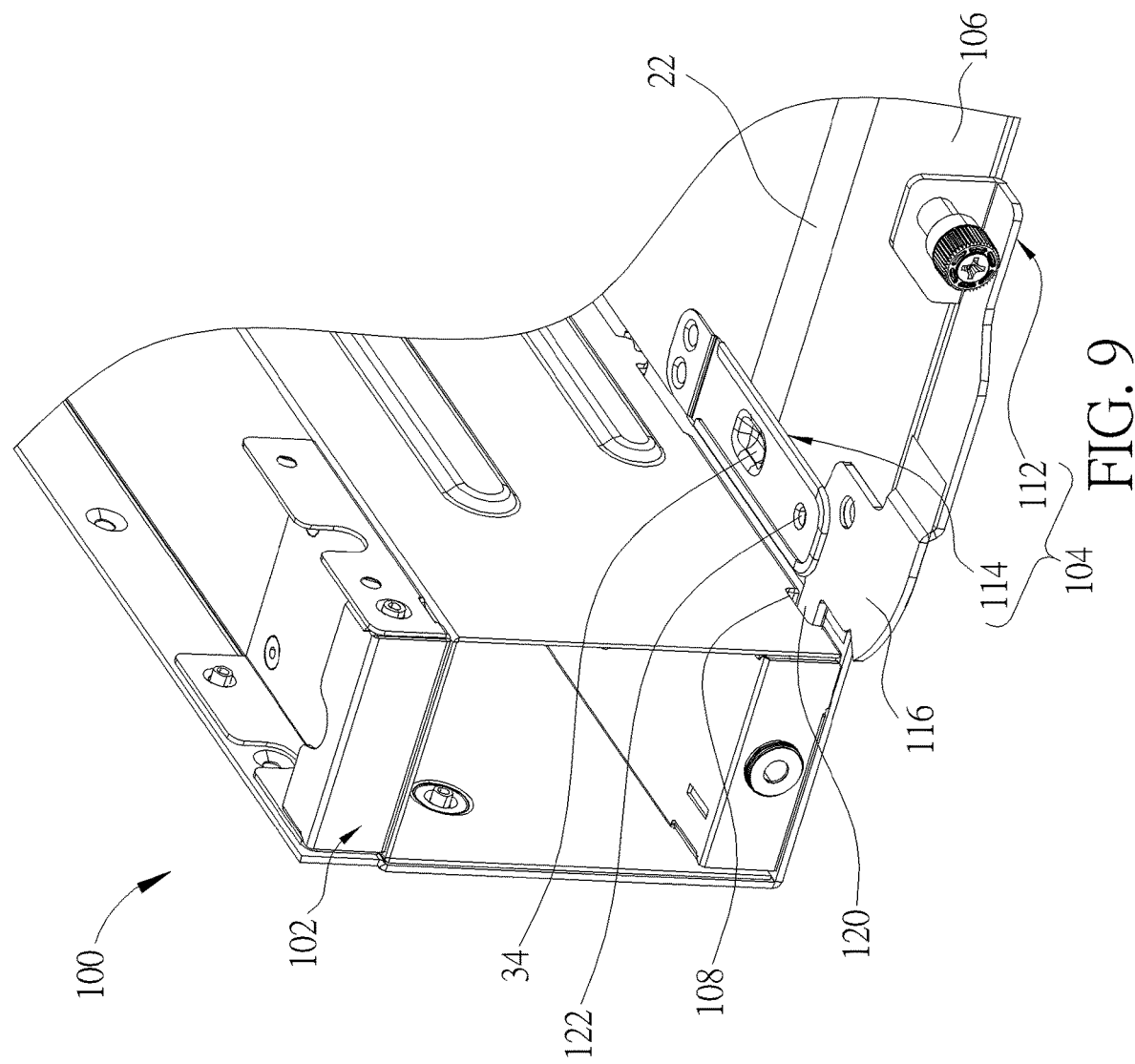
FIG. 9 is an internal diagram of the server apparatus in FIG. 7.
Figure 10:
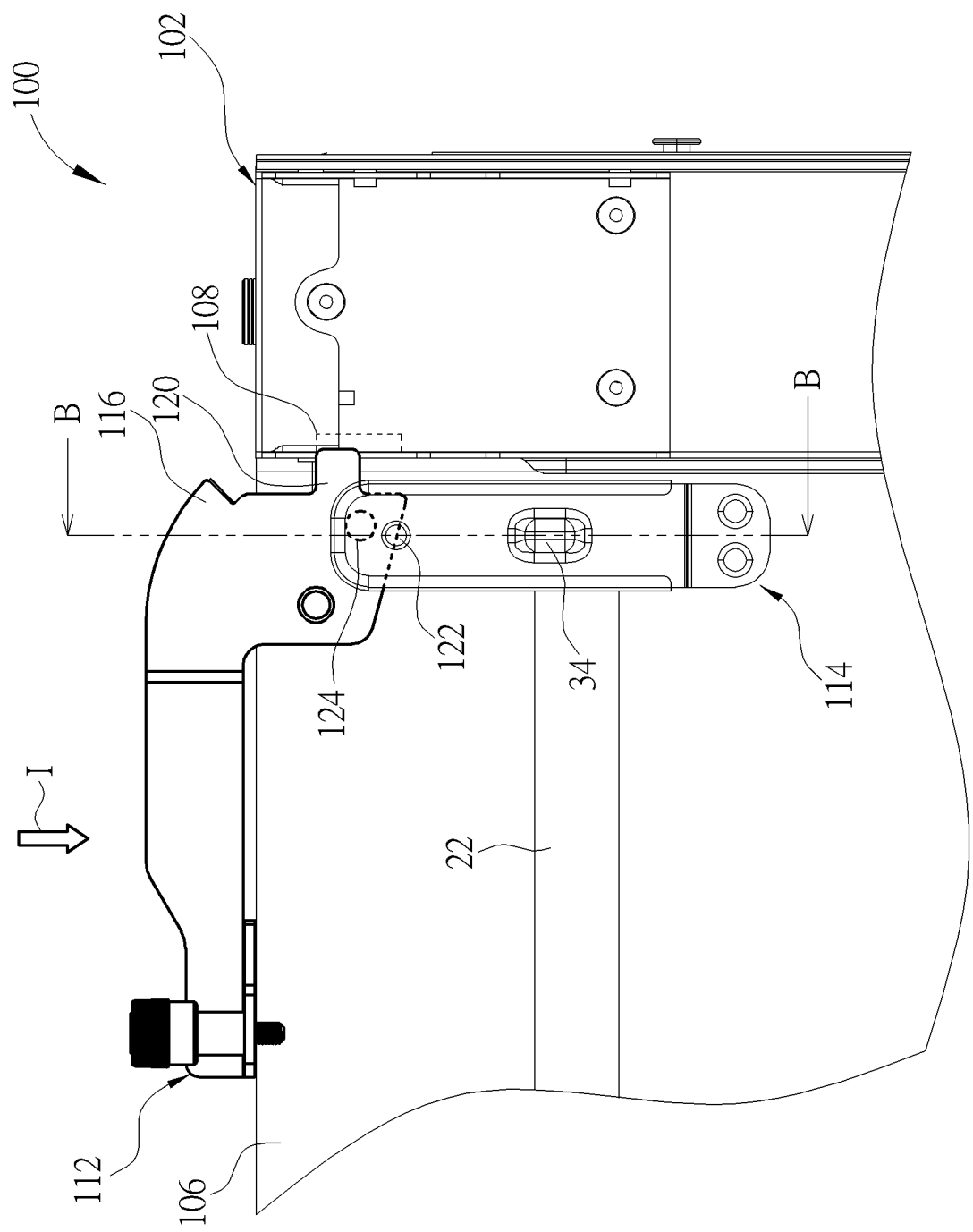
FIG. 10 is a partial top view of the server apparatus in FIG. 9.

It should be mentioned that the first protruding structure 22 and the second protruding structure 34 could be omitted selectively for simplifying the mechanical design of the server apparatus provided by the present disclosure. Furthermore, the handle configuration of the present disclosure is not limited to the design of rotatably connecting the pivot portion of the handle to the partition of the casing mentioned in the aforesaid embodiment. That is, in another embodiment, the present disclosure could adopt the design of rotatably connecting the pivot portion of the handle to a bottom board of the casing. For example, please refer to FIG. 7, FIG. 8, FIG. 9, and FIG. 10. FIG. 7 is a partial exploded diagram of a server apparatus 100 according to another embodiment of the present disclosure. FIG. 8 is a partial diagram of a tray mechanism 104 in FIG. 7 being inserted into a casing 102. FIG. 9 is an internal diagram of the server apparatus 100 in FIG. 7. FIG. 10 is a partial top view of the server apparatus 100 in FIG. 9. For clearly showing the internal structural relationship of the server apparatus 100, a tray 110 is omitted in FIG. 9. Components both mentioned in this embodiment and the aforesaid embodiment represent components with similar structures or functions, and the related description is omitted herein.

As shown in FIG. 7, FIG. 8, FIG. 9, and FIG. 10, the server apparatus 100 includes the casing 102, a tray mechanism 104, and at least one server module 16 (one shown in FIG. 7 and briefly depicted by dotted lines, but the present disclosure is not limited thereto). A second board 106 of the casing 102 could be a bottom board and have a first engaging structure 108 and the first protruding structure 22 formed thereon, and the tray mechanism 104 includes the tray 110, a handle 112, and an elastic member 114 (e.g., an elastic sheet, but the present disclosure is not limited thereto). The server module 16 is disposed on the tray 110 and is mounted in the casing 102 via the tray 110. The handle 112 has a pivot portion 116. The pivot portion 116 is pivoted to a first board 111 of the tray 110 corresponding to the second board 106 to make the handle 112 rotatable between a first position and a second position relative to the tray 110. The pivot portion 116 could preferably have a second engaging structure 120. The elastic member 114 could be preferably connected to the first board 111 by a riveting process or a screw locking process (but the present disclosure is not limited thereto) and have the second protruding structure 34 and an interfering structure 122 penetrating through the first board 111. The first protruding structure 22 could protrude inward from the second board 106 of the casing 102 by a punching process, and the second protruding structure 34 could protrude outward from the elastic member 114 by a punching process for interfering with the first protruding structure 22. The first engaging structure 108 could be preferably a positioning slot, the second engaging structure 120 could be preferably a positioning hook, and the interfering structure 122 could be preferably a protruding pillar formed on the elastic member 114 by a drawing process (but the present disclosure is not limited thereto) to be disposed through an interfering hole 124 of the pivot portion 116 for generating the handle positioning effect.

Figure 11:
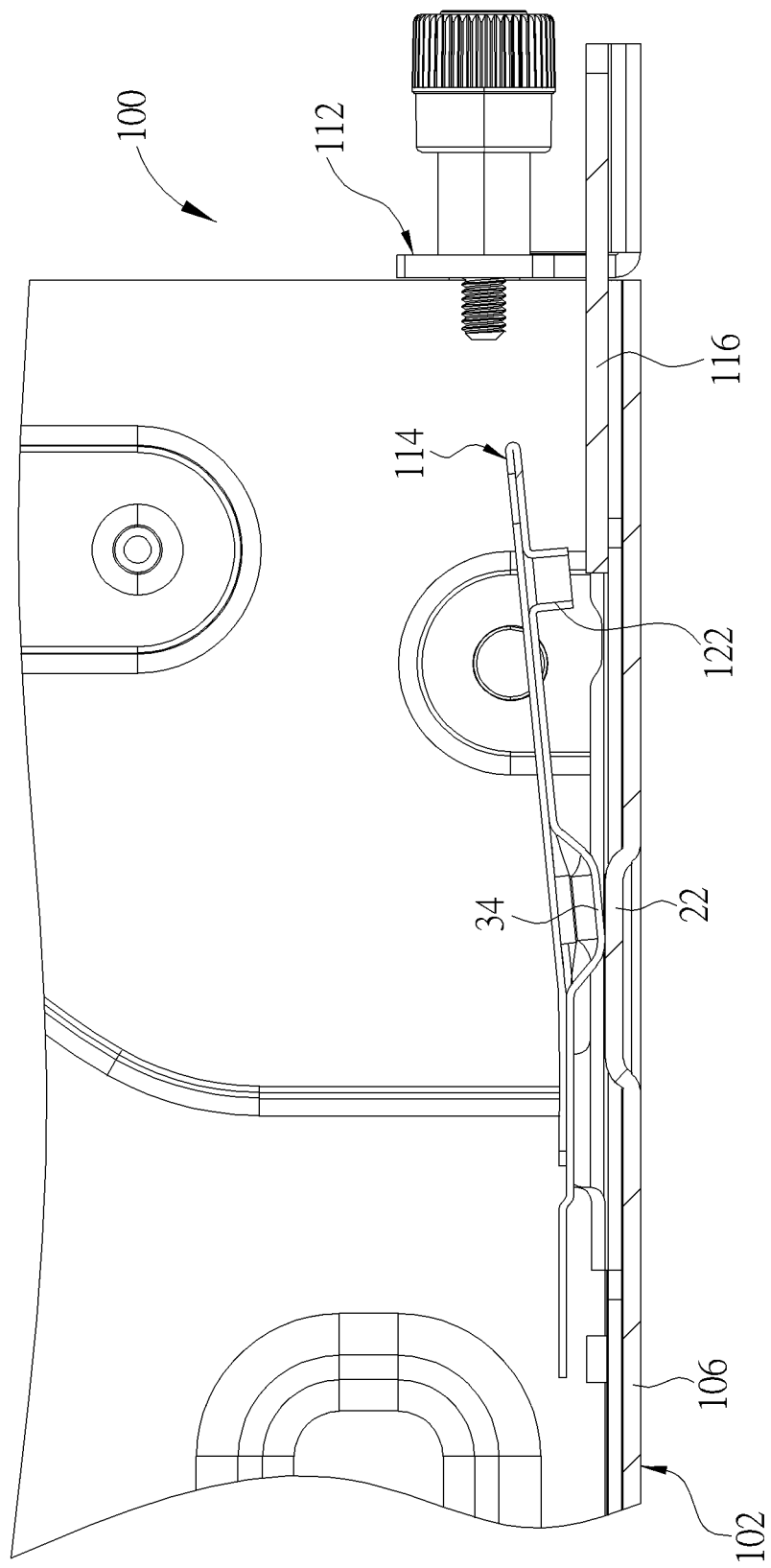
FIG. 11 is a cross-sectional diagram of the tray mechanism in FIG. 10 along a cross-sectional line B-B.
Figure 12:
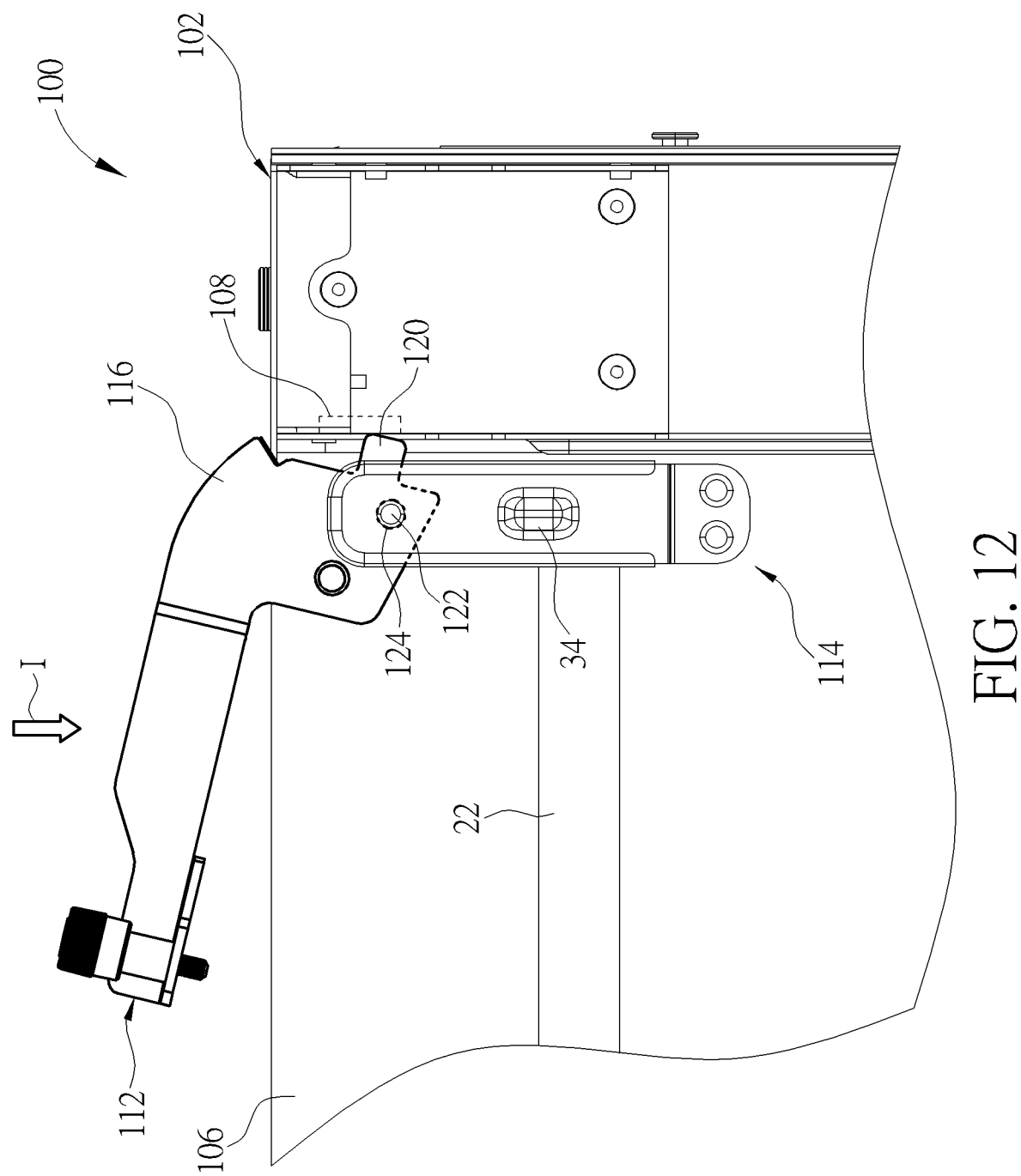
FIG. 12 is a partial top view of the tray mechanism in FIG. 10 when a handle rotates to a first position.

More detailed description for the operation of the tray mechanism 104 is provided as follows. Please refer to FIG. 8, FIG. 9, FIG. 10, FIG. 11, and FIG. 12. FIG. 11 is a cross-sectional diagram of the tray mechanism 104 in FIG. 10 along a cross-sectional line B-B. FIG. 12 is a partial top view of the tray mechanism 104 in FIG. 10 when the handle 112 rotates to the first position. When the handle 112 is located at the second position as shown in FIG. 9, the second engaging structure 120 can be engaged with the first engaging structure 108, to make the tray mechanism 104 disposed in the casing 102 steadily. At this time, as shown in FIG. 11, the first engaging structure 22 can push the second protruding structure 34 to cause elastic deformation of the elastic member 114, so as to move the interfering structure 122 for not interfering with the pivot portion 116. As such, the handle 112 can be rotatable between the second position and the first position.

On the other hand, when the user wants to perform the extraction operation of the tray mechanism 104, the user just needs to pull the handle 112 to rotate from the second position as shown in FIG. 10 to the first position as shown in FIG. 12 for releasing engagement between the second engaging structure 120 and the first engaging structure 108. Subsequently, since the second engaging structure 120 no longer hooks the first engaging structure 108, the user can pull the handle 112 to extract the tray 110 outward relative to the casing 102, so as to make the second protruding structure 34 not interfere with the first protruding structure 22 with outward movement of the tray 110 relative to the casing 102. Accordingly, the interfering structure 122 can protrude from the first board 111 to be engaged with the interfering hole 124 for positioning the handle 112 at the first position. Finally, the user can keep pulling the handle 112 to extract the tray mechanism 104 having the server module 16 mounted therein out of the casing 102 completely for subsequent replacement or maintenance of the server module 16.

On the contrary, when the user wants to perform the assembly operation of the tray mechanism 104, the user just needs to push the handle 112 (at this time, as mentioned above, the interfering structure 122 is engaged with the interfering hole 124 to position the handle 112 at the first position steadily) to insert the tray mechanism 104 into the casing 102 along the insertion direction I. During this process, as shown in FIG. 12, the second engaging structure 120 does not interfere with the first engaging structure 108. In such a manner, the present disclosure can surely prevent the second engaging structure 120 from colliding with the first engaging structure 108 when the tray mechanism 104 is inserted into the casing 102 along the insertion direction I, so as to allow that the user can insert the tray mechanism 104 to a position as shown in FIG. 12 along the insertion direction I smoothly. At this time, as shown in FIG. 11, since the first protruding structure 22 has already interfered with the second protruding structure 34 to cause elastic deformation of the elastic member 114, the interfering structure 122 can move relative to the first board 111 to not interfere with the pivot portion 116. Subsequently, the user can rotate the handle 112 from the first position as shown in FIG. 12 to the second position as shown in FIG. 10 for rotating the second engaging structure 120 to hook the first engaging structure 108. As such, the tray mechanism 104 can be mounted in the casing 102 steadily (as shown in FIG. 8), so as to complete the assembly operation of the tray mechanism 104.

To be noted, the interfering structural design of the tray mechanism 104 is not limited to the aforesaid design in which the protruding pillar is disposed through the interfering hole. That is, in another embodiment, the present disclosure could adopt the design in which a tongue sheet formed on the elastic member is inserted into a positioning slot formed on the pivot portion. To be brief, in another embodiment, the interfering structure could be a tongue sheet bent from the elastic member by a punching process (but the present disclosure is not limited thereto), and an interfering slot is formed on the pivot portion corresponding to the tongue sheet. As such, the tongue sheet could be inserted into the interfering slot for preventing clockwise and counterclockwise rotation of the handle. Furthermore, the interfering structural designs (e.g., the design that the protruding pillar is engaged with the limiting recess, the design that the protruding pillar is disposed through the interfering hole, and the design that the tongue sheet is inserted into the positioning slot) and the engaging structural designs (e.g., the design that the notch rotates to hook the positioning pillar and the design that the positioning hook is engaged with the positioning slot) mentioned in the aforesaid embodiments could be interchangeably applied to the tray mechanism for improving structural design flexibility of the tray mechanism provided by the present disclosure. The related description for the derived embodiments could be reasoned by analogy according to the aforesaid embodiments and omitted herein. As for which design is adopted, it depends upon the practical application of the tray mechanism of the present disclosure and is not limited to the aforesaid embodiments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server apparatus comprising:
   a casing having a first engaging structure;
   a tray mechanism comprising:
      a tray having a first board;
      a handle having at least one pivot portion, the pivot portion being pivoted to the first board to make the handle rotatable between a first position and a second position relative to the tray; and
      an elastic member connected to the first board and having at least one interfering structure penetrating through the first board, the interfering structure interfering with the pivot portion to keep the handle at the first position and to make the pivot portion and the first engaging structure not interfere with each other when the tray is inserted into the casing along an insertion direction; and
   at least one server module disposed on the tray.

2. The server apparatus of claim 1, wherein the pivot portion has a second engaging structure corresponding to the first engaging structure, and when the handle rotates to the second position, the second engaging structure rotates to be engaged with the first engaging structure.

3. The server apparatus of claim 2, wherein the first engaging structure is a positioning pillar, the second engaging structure is a notch, and the interfering structure is a protruding pillar; when the protruding pillar abuts against a protruding edge of the notch for positioning the handle at the first position, the positioning pillar is misaligned with the notch without interference in the insertion direction; when the handle rotates to the second position, the notch rotates to be engaged with the positioning pillar.

4. The server apparatus of claim 3, wherein a limiting recess extends from the protruding edge, and the protruding pillar is engaged with the limiting recess to position the handle at the first position.

5. The server apparatus of claim 1, wherein a limiting pin protrudes from the first board, the pivot portion has an arc-shaped slot corresponding to the limiting pin, and the limiting pin is disposed through the arc-shaped slot to limit the rotation range of the handle.

6. The server apparatus of claim 1, wherein the casing further has a first protruding structure, the elastic member further has a second protruding structure, and when the tray is inserted into the casing and the first protruding structure pushes the second protruding structure, the interfering structure moves relative to the first board for not interfering with the pivot portion, so as to make the handle rotatable to the second position to be engaged with the first engaging structure.

7. The server apparatus of claim 6, wherein the first protruding structure protrudes inward from the casing by a punching process, and the second protruding structure protrudes outward from the elastic member by a punching process.

8. The server apparatus of claim 2, wherein the first engaging structure is a positioning slot, the second engaging structure is a positioning hook, the interfering structure is a protruding pillar, and the pivot portion has an interfering hole corresponding to the protruding pillar; when the protruding pillar is disposed through the interfering hole to position the handle at the first position, the positioning hook is misaligned with the positioning slot without interference in the insertion direction; when the handle rotates to the second position, the positioning hook rotates to hook the positioning slot.

9. The server apparatus of claim 2, wherein the first engaging structure is a positioning slot, the second engaging structure is a positioning hook, the interfering structure is a tongue sheet, and the pivot portion has an interfering slot corresponding to the tongue sheet; when the tongue sheet is inserted into the interfering slot to position the handle at the first position, the positioning hook is misaligned with the positioning slot without interference in the insertion direction; when the handle rotates to the second position, the positioning hook rotates to hook the positioning slot.

10. The server apparatus of claim 1, wherein the casing has a second board corresponding to the first board, and the first engaging structure and the first protruding structure are formed on the second board.

11. The server apparatus of claim 10, wherein the second board is a partition or a bottom board of the casing.

12. A tray mechanism suitable for assembly of at least one electronic module and a casing, the casing having a first engaging structure formed thereon, the tray mechanism comprising:
   a tray having a first board, the electronic module being disposed on the tray;
   a handle having at least one pivot portion, the pivot portion being pivoted to the first board to make the handle rotatable between a first position and a second position relative to the tray; and
   an elastic member connected to the first board and having at least one interfering structure penetrating through the first board, the interfering structure interfering with the pivot portion to keep the handle at the first position and to make the pivot portion and the first engaging structure not interfere with each other when the tray is inserted into the casing along an insertion direction.

13. The tray mechanism of claim 12, wherein the pivot portion has a second engaging structure corresponding to the first engaging structure, and when the handle rotates to the second position, the second engaging structure rotates to be engaged with the first engaging structure.

14. The tray mechanism of claim 13, wherein the first engaging structure is a positioning pillar, the second engaging structure is a notch, and the interfering structure is a protruding pillar; when the protruding pillar abuts against a protruding edge of the notch for positioning the handle at the first position, the positioning pillar is misaligned with the notch without interference in the insertion direction; when the handle rotates to the second position, the notch rotates to be engaged with the positioning pillar.

15. The tray mechanism of claim 14, wherein a limiting recess extends from the protruding edge, and the protruding pillar is engaged with the limiting recess to position the handle at the first position.

16. The tray mechanism of claim 12, wherein a limiting pin protrudes from the first board, the pivot portion has an arc-shaped slot corresponding to the limiting pin, and the limiting pin is disposed through the arc-shaped slot to limit the rotation range of the handle.

17. The tray mechanism of claim 13, wherein the first engaging structure is a positioning slot, the second engaging structure is a positioning hook, the interfering structure is a protruding pillar, and the pivot portion has an interfering hole corresponding to the protruding pillar; when the protruding pillar is disposed through the interfering hole to position the handle at the first position, the positioning hook is misaligned with the positioning slot without interference in the insertion direction; when the handle rotates to the second position, the positioning hook rotates to hook the positioning slot.

18. The tray mechanism of claim 13, wherein the first engaging structure is a positioning slot, the second engaging structure is a positioning hook, the interfering structure is a tongue sheet, and the pivot portion has an interfering slot corresponding to the tongue sheet; when the tongue sheet is inserted into the interfering slot to position the handle at the first position, the positioning hook is misaligned with the positioning slot without interference in the insertion direction; when the handle rotates to the second position, the positioning hook rotates to hook the positioning slot.

19. The tray mechanism of claim 12, wherein the casing further has a first protruding structure, the elastic member further has a second protruding structure, and when the tray is inserted into the casing and the first protruding structure pushes the second protruding structure, the interfering structure moves relative to the first board for not interfering with the pivot portion, so as to make the handle rotatable to the second position to be engaged with the first engaging structure.

20. The tray mechanism of claim 19, wherein the first protruding structure protrudes inward from the casing by a punching process, and the second protruding structure protrudes outward from the elastic member by a punching process.

* * * * *